United States Patent [19]

Hadwiger et al.

[11] Patent Number: 4,924,590
[45] Date of Patent: May 15, 1990

[54] METHOD FOR MAKING METAL CORE PRINTED CIRCUIT BOARD

[75] Inventors: Helmut Hadwiger, Munich; Hans Schmidt, Eurasburg, both of Fed. Rep. of Germany

[73] Assignee: Siemens Aktiengesellschaft, Berlin and Munich, Fed. Rep. of Germany

[21] Appl. No.: 291,119

[22] Filed: Dec. 28, 1988

[30] Foreign Application Priority Data

Jan. 8, 1988 [DE] Fed. Rep. of Germany ....... 3800348

[51] Int. Cl.$^5$ .............................................. H05K 1/05
[52] U.S. Cl. ...................................... 29/848; 174/250; 427/97
[58] Field of Search ................ 174/68.5; 29/846, 848, 29/834; 361/414; 427/97

[56] References Cited

U.S. PATENT DOCUMENTS

| | | | |
|---|---|---|---|
| 3,558,441 | 1/1971 | Chadwick et al. | 427/97 X |
| 3,745,095 | 7/1973 | Chadwick et al. | 427/97 X |
| 3,932,932 | 1/1976 | Goodman | 361/414 X |
| 3,934,334 | 1/1976 | Hanni | 174/68.5 X |
| 3,934,335 | 1/1976 | Nelson | 174/68.5 X |
| 4,226,659 | 10/1980 | Griffith et al. | 29/834 X |
| 4,601,916 | 7/1986 | Arachtingi | |
| 4,663,208 | 5/1987 | Ninomiya et al. | 174/68.5 X |
| 4,694,120 | 9/1987 | Accou | 174/68.5 |
| 4,769,270 | 9/1988 | Nagamatsu et al. | |
| 4,777,721 | 10/1988 | Choinski | 29/846 |
| 4,791,248 | 12/1988 | Oldenettel | 174/68.5 |

FOREIGN PATENT DOCUMENTS

0206179A3 12/1986 European Pat. Off. .
1432771 12/1966 France .
2000913A 1/1979 United Kingdom .

OTHER PUBLICATIONS

"Allgemeines und Anwendungsgebiete", by G. Hermann, pp. 313-329.

*Primary Examiner*—Carl J. Arbes
*Attorney, Agent, or Firm*—Hill, Van Santen, Steadman & Simpson

[57] ABSTRACT

A method for the manufacturing of a metal core pc board which provides for manufacturing of two or three dimensional metal core pc boards of any form with or without throughplating. The manufacturing of such pc boards can occur by injection molding, injection/compressing molding or by a pressing method. High-heat resistant thermoplastics, as well as duroplastics are preferably employed as pc board materials. A metal with good thermal conductibility is used for the core. The material is selected such that the thermal expansion coefficients of the metal core and the pc board material are optimally equal. The manufacturing contains the following steps: lamination of the metal plate with a plastic foil on one or both sides; introduction of the desired hole pattern with a corresponding over dimension into the laminated metal plate; placing of such prepared metal core in an injection molding tool; and thermoforming the plastic on the laminated core over the plastic foil and simultaneously filling out the holes to a final dimension with the plastic.

22 Claims, 1 Drawing Sheet

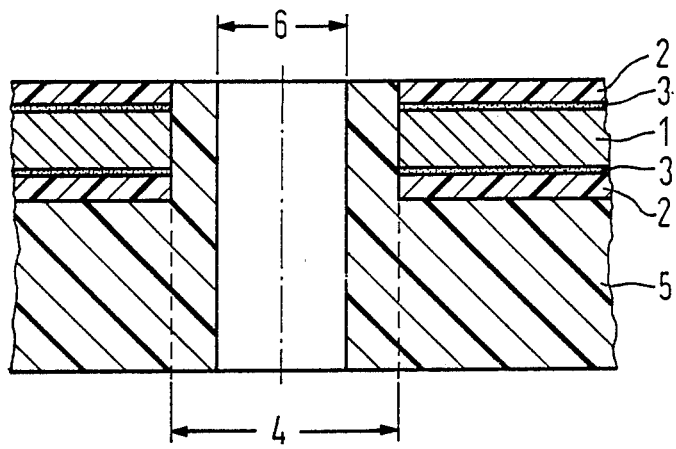

METHOD FOR MAKING METAL CORE PRINTED CIRCUIT BOARD

BACKGROUND OF THE INVENTION

The present invention relates to a method for the manufacturing of a metal core pc board whose core is composed of a metal with good thermal conductibility, preferably aluminum, copper, brass or steel, whereby the thermal expansion coefficients of the metal core and other pc board materials are optimally equal. The metal core pc board has a core which is composed of metal with good thermal conductibility, and has materials which have optimally equal thermal expansion coefficients.

In the case of large scale integration (LSI) components or power components, the elimination of heat that accumulates in the components is a significant problem which can be solved with the integration of a metal core in the printed circuit board which provides better thermal conductivity of the pc board connected therewith.

Prior manufacturing methods used for metal core plates are: coating of the metal core with epoxide-resin powder by powder painting; electro-static coating of the metal core; electro-porethic coating of the metal core; dip-coating of the metal core; and core lamination. The term electro-phoretic refers to the transport of charged particles in a non-conductive fluid under the influence of an electrical voltage.

These methods and their advantages and disadvantages are described in G. Hermann, Handbuch der Leiterplattentechnik, chapter 17, second edition, Eugen G. Lenze publishing company, Saulgau, 1982.

The metal core pc boards manufactured in this manner have particular weak points in the throughplating.

SUMMARY OF THE INVENTION

An object of the present invention is to provide a method for the manufacturing of a metal core pc board, as well as the metal core pc board itself, with reliably formed throughplating.

The prior art problem is solved according to the method and apparatus of the present invention.

The method has the steps of manufacturing the pc boards of any form on a plastic by thermoforming, whereby the metal core is laminated with a plastic foil at least on one side, and this laminated core being then placed into a shaping tool, is enveloped at least on one side with plastic on the plastic foil, and at the same time, filling up holes in the pc board to their final dimension, whereby the final contour of the pc board is created.

The metal core pc board has the following structure: a metal core; a plastic foil that is applied to the metal core by means of adhesives at least on one side; and a plastic applied to the prepared metal core by a thermoforming method at least on one side, whereby the hollow-cylindrical part of holes in the metal core, the difference between the holes constructed with an over dimension and their final dimension, is also composed of plastic.

The essential advantage of the present invention is that the number of manufacturing steps is decreased, and the cited disadvantage does not occur. Furthermore, sealed plastic surfaces are present at the through-platings so that a uniform metalization of the through-platings is guaranteed. According to the method of the present invention pc boards with insulated outer contours can be manufactured without additional cost or equipment.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing and in which: The single FIGURE shows a cross-section of one part of a metal core pc board of the present invention.

DESCRIPTION OF THE PREFERRED EMBODIMENT

An aluminum plate serves as metal core 1, this aluminum plate being laminated in this case on both sides with a plastic foil 2. An adhesive 3 is provided between the metal core 1 and the plastic foil 2. The adhesive may be a type of adhesive which has high temperature resistance. The laminated plate is bored or the desired hole pattern with a corresponding over sized dimension may be pressed or punched into the laminated metal plate. A boring is denoted by reference numeral 4. The pc board is subsequently enveloped on one side in an injection molding tool with a plastic 5. This plastic 5 is preferably a thermoplastic. Thermoplastic is one subgroup of plastics. Also useable is another subgroup of plastics known as thermoset plastics. Thereby, the holes 4 are insulated and filled out to the final dimension 6. Due to the enveloping event, the lamination foil 2 is tightly melted to the thermoplastic 5 at all contact surfaces.

The metal core pc boards can be two or three dimensional. The molding method mentioned above can be replaced by an injection/compressing molding or a pressing method. The metal core 1 can be laminated with the plastic foil 2 on one side or both sides, and likewise on one or both sides, be coated with the plastic 5. However, as a rule, a plastic foil 2 is pertinently as a base for the application of the plastic 5. The selection of the materials is structured such that the metal core has a high thermal conductivity, and that the matching of the different, applied materials i.e. the combination of metals and plastics regarding the different thermal expansion coefficients of the individual components have no great deviation. Thermal stress, caused by heat expansions in or between different layers, has disadvantageous effects but is prevented by the present invention. As a rule, that metal core 1 of a metal core pc board that is prepared with plastic foil is enveloped with the plastic 5 within its holes 4 and planarly proceeding from one side. Thus, an outside and all-around insulation of the pc board can be produced at the same time.

It is also possible to only extend the metal core 1 over a small part of the entire pc board, or to coat the metal core 1 only partially by means of the plastic 5. The final dimension of the holes 4 that were bored or pressed with an over sized dimension, is obtained by the plastic 5 in the thermoforming method, whereby the final dimension is achieved by using pins of the desired diameter in a tool. Metal core pc boards can basically be manufactured with a certain hole pattern. However, for the application as a housing part or for the equipping with strictly surface mountable components, a metal core pc board can be manufactured without holes 4 by means of the method of the present invention.

The plastics that are utilized for the plastic foil 2 and the plastic 5 are selected such that the same method can be applied both for the metalization and for the manufacturing of the interconnects. If, for example, the chemical substance polyetherimide is used as plastic for the plastic foil 2 and the plastic 5, standard electroplating methods which are offered by various firms and usually involve one or several pre-treatment baths, or one main treatment bath can be used for this metalization of polyetherimide. Polyetherimide belongs to the group of thermoplastics.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for the manufacturing of a metal core pc board whose core is composed of a metal with good thermal conductibility, preferably one of aluminum, copper, brass or steel, the thermal expansion coefficients of the metal core and other pc board materials being substantially equal, comprising manufacturing metal core pc boards of any form on a plastic by thermoforming, the metal core being laminated with a plastic foil at least on one side, and this laminated core being then placed into a shaping tool and enveloped at least on one side with an additional plastic layer on the plastic foil, and at the same time, filling up holes present in the pc board to their final dimension, whereby the final contour of the pc board is created.

2. The method according to claim 1, wherein the metal core only extends over a part of the pc board.

3. The method according to claim 1, wherein the enveloping by means of additional plastic layer occurs only partially.

4. The method according to claim 1, wherein a thermoset plastic is used as the additional plastic layer.

5. The method according to claim 1, wherein thermoplastic is used as the additional plastic layer.

6. The method according to claim 1, wherein the laminated plastic foil and the additional plastic layer that serves for the enveloping are composed of the same kind of plastic.

7. The method according to claim 1, wherein adhesives in the form of adhesive foils are used for the application of the laminated plastic foil.

8. The method according to claim 1, wherein liquid adhesives are used for the application of the laminated plastic foil.

9. The method according to claim 7, wherein the adhesives are high-temperature resistant.

10. The method according to claim 8, wherein the adhesives are high-temperature resistant.

11. The method according to claim 1, wherein the plastic foil is applied without adhesive by roller lamination after corresponding pretreatment of the metal core, for example with a coupling agent or treatment.

12. A method for the manufacturing of a metal core pc board whose core is composed of a metal with good thermal conductibility, the thermal expansion coefficients of the metal core and other pc board materials being substantially equal, comprising the steps of: laminating a metal core with a plastic foil at least on one side of the metal core; forming a plurality of holes in the laminated metal core, said holes having an over size dimension; thermoforming an additional plastic layer onto at least said one side of said laminated core over said plastic foil and simultaneously filling out said holes to a final dimension with said additional plastic layer.

13. The method according to claim 12, wherein the metal core only extends through a part of the pc board.

14. The method according to claim 12, wherein the additional plastic layer is thermoformed only partially over said one side.

15. The method according to claim 12, wherein said additional plastic layer is a thermoset plastic.

16. The method according to claim 12, wherein said additional plastic layer is a thermoplastic.

17. The method according to claim 12, wherein the laminated plastic foil and the additional plastic layer are composed of the same kind of plastic.

18. The method according to claim 12, wherein adhesives in the form of adhesive foils are used for the application of the laminated plastic foil.

19. The method according to claim 12, wherein liquid adhesives are used for the application of the laminated plastic foil.

20. The method according to claim 18, wherein the adhesives are high-temperature resistant.

21. The method according to claim 19, wherein the adhesives are high-temperature resistant.

22. The method according to claim 12, wherein the plastic foil is applied without adhesive by roller lamination after corresponding pretreatment of the metal core.

* * * * *